United States Patent [19]

Marozsan et al.

[11] Patent Number: 5,038,466
[45] Date of Patent: Aug. 13, 1991

[54] MULTIFUNCTIONAL END EFFECTOR AND METHOD OF CONVERTING SINGLE PURPOSE ROBOT ARM

[75] Inventors: Andrew Marozsan; Kenneth M. Wasko, both of Boca Raton, Fla.

[73] Assignee: Motorola, Inc., Schaumburg, Ill.

[21] Appl. No.: 389,473

[22] Filed: Aug. 4, 1989

[51] Int. Cl.$^5$ .................... H05K 3/34; B23P 19/00
[52] U.S. Cl. ........................ 29/840; 29/740; 29/401.1; 29/705; 73/866.5; 118/300; 294/64.1; 901/30; 901/31; 901/39
[58] Field of Search ............... 29/840, 705, 740, 834, 29/743, 401.1; 901/30, 31, 39; 294/64.1; 118/300; 73/866.5

[56] References Cited

U.S. PATENT DOCUMENTS

| | | | |
|---|---|---|---|
| 3,337,941 | 8/1967 | Drop | 29/705 |
| 4,631,816 | 12/1986 | Fujita et al. | 29/740 |
| 4,653,664 | 3/1987 | Hineno et al. | 29/740 X |
| 4,706,379 | 11/1987 | Seno et al. | 29/740 |
| 4,794,689 | 1/1989 | Seno et al. | 29/705 X |

FOREIGN PATENT DOCUMENTS 63-301600 12/1988 Japan ....................... 29/705

OTHER PUBLICATIONS

IBM Tech. Discl. Bull., vol. 22, No. 7, Dec. 1979 pp. 2757-2761 by Huebener.

*Primary Examiner*—Carl E. Hall
*Assistant Examiner*—Carl J. Arbes
*Attorney, Agent, or Firm*—William E. Koch; Vincent B. Ingrassia; Anthony J. Sarli, Jr.

[57] ABSTRACT

A single purpose robot arm end effector having a ring shaped frame positioned around the periphery thereof with a plurality of extendable drivers mounted in the frame for movement between a nonfunctioning position and an operative position. Each of said drivers can be tooled up for unique or dedicated applications so that the arm will be performing many different functions during most of a manufacturing cycle, instead of only performing one function for a short period of time during the manufacturing cycle.

11 Claims, 6 Drawing Sheets

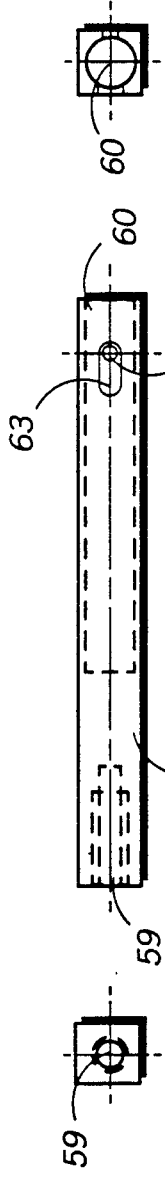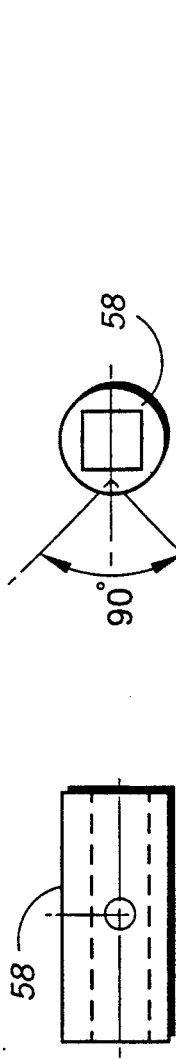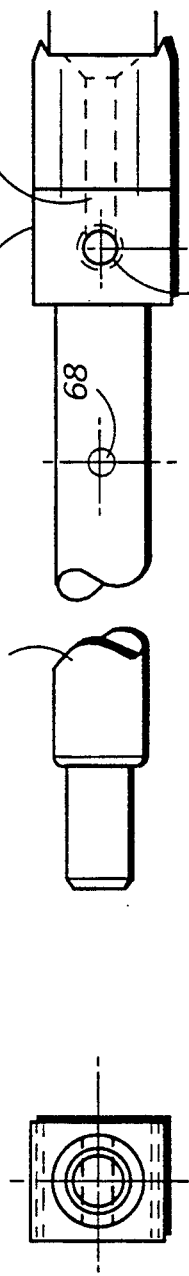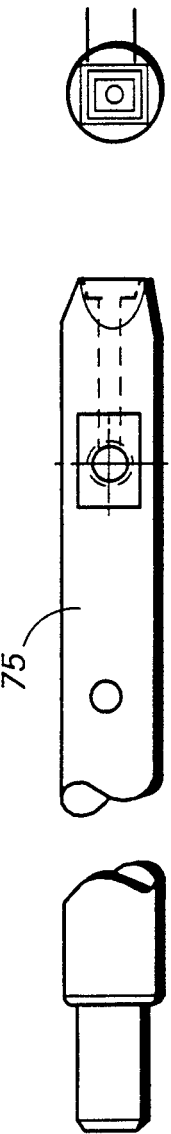

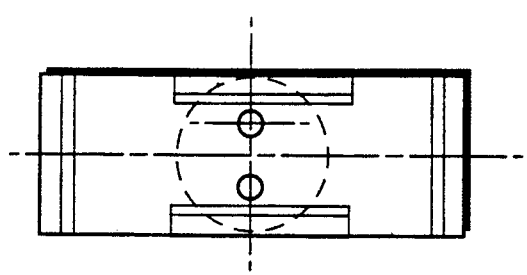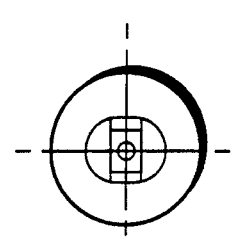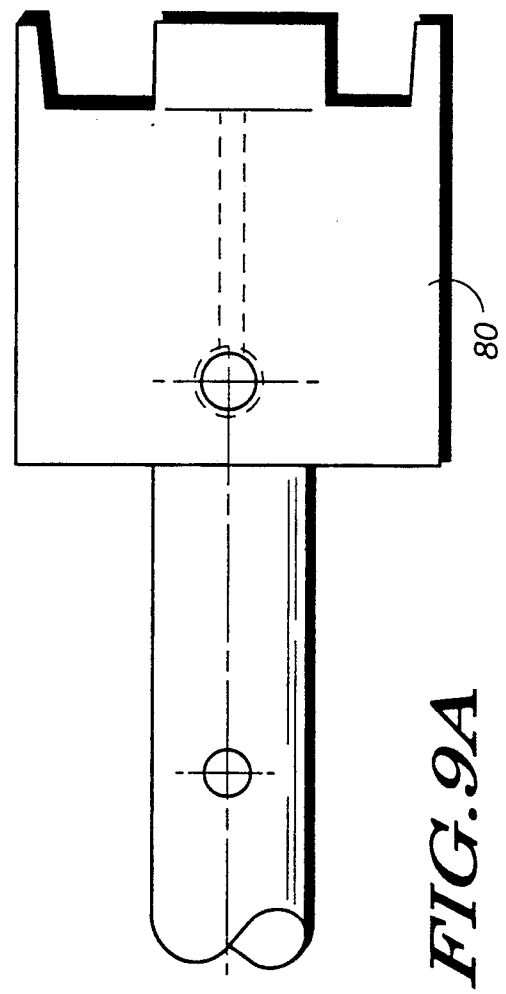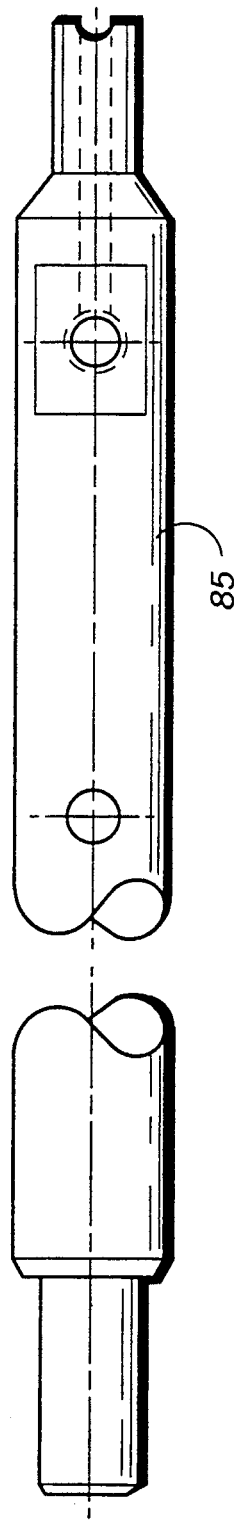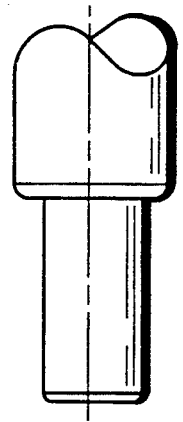
FIG.9B
FIG.10B
FIG.9A
FIG.10A

MULTIFUNCTIONAL END EFFECTOR AND METHOD OF CONVERTING SINGLE PURPOSE ROBOT ARM

The present invention pertains to robot arm end effectors and more particularly to robot arm end effectors capable of providing a plurality of functions.

BACKGROUND OF THE INVENTION

In industry today, many mechanical devices, generally referred to as robots, are used to perform many repetitive tasks. Robots usually include, or may consist almost completely of, an arm having an end, referred to as an end effector, which end effector is either dedicated to a certain application or designed to handle a group of components that are different in sizes but have the same geometry. A dedicated end effector usually means a dedicated robot. If the cycle time is controlled by another cell, that cell and the robot arm are only utilized a fraction of the time, or manufacturing cycle. For example, if a robot arm end effector is designed to place a component on a printed circuit board, once the component is placed on the board the arm is idle until all of the remaining tasks are completed and the next board is moved into place. Since robot arms are relatively expensive and require considerable operating room, this can be a very serious problem.

SUMMARY OF THE INVENTION

It is an object of the present invention to provide a new and improved multi-functional robot arm end effector.

It is a further object of the present invention to provide a method of converting a single function robot arm end effector into a multi-function robot arm end effector.

These and other objects are realized in a multi-function end effector and a new method and apparatus for converting a single function end effector into a multi-function end effector including a frame fixedly attached to the single function end effector, a plurality of individually retractable drivers mounted on said frame for movement between an operative extended position and a retracted position, a plurality of operating heads each designed to perform a predetermined task and each being operatively attached to one of said plurality of drivers, and controllable means attached to each of said operating heads for controlling each of said heads to perform the predetermined task in response to control signals applied thereto, and further attached to said power means for individually controlling the movement of said drivers between the first and second positions.

BRIEF DESCRIPTION OF THE DRAWINGS

Referring to the drawings:

FIGS. 5A and 5B are a side view and a right end plan view, respectively, of a portion of the multi-function robot arm end effector illustrated in FIG. 1;

FIGS. 6A, 6B and 6C are a side view, a left end plan view and a right end plan view, respectively, of another portion of the multi-function robot arm illustrated in FIG. 1;

FIGS. 7A and 7B through 10A and 10B are side views and right end plan views, respectively, of four different operating heads for the multi-function robot arm end effector illustrated in FIG. 1.

DESCRIPTION OF THE PREFERRED EMBODIMENTS

Figure 1:
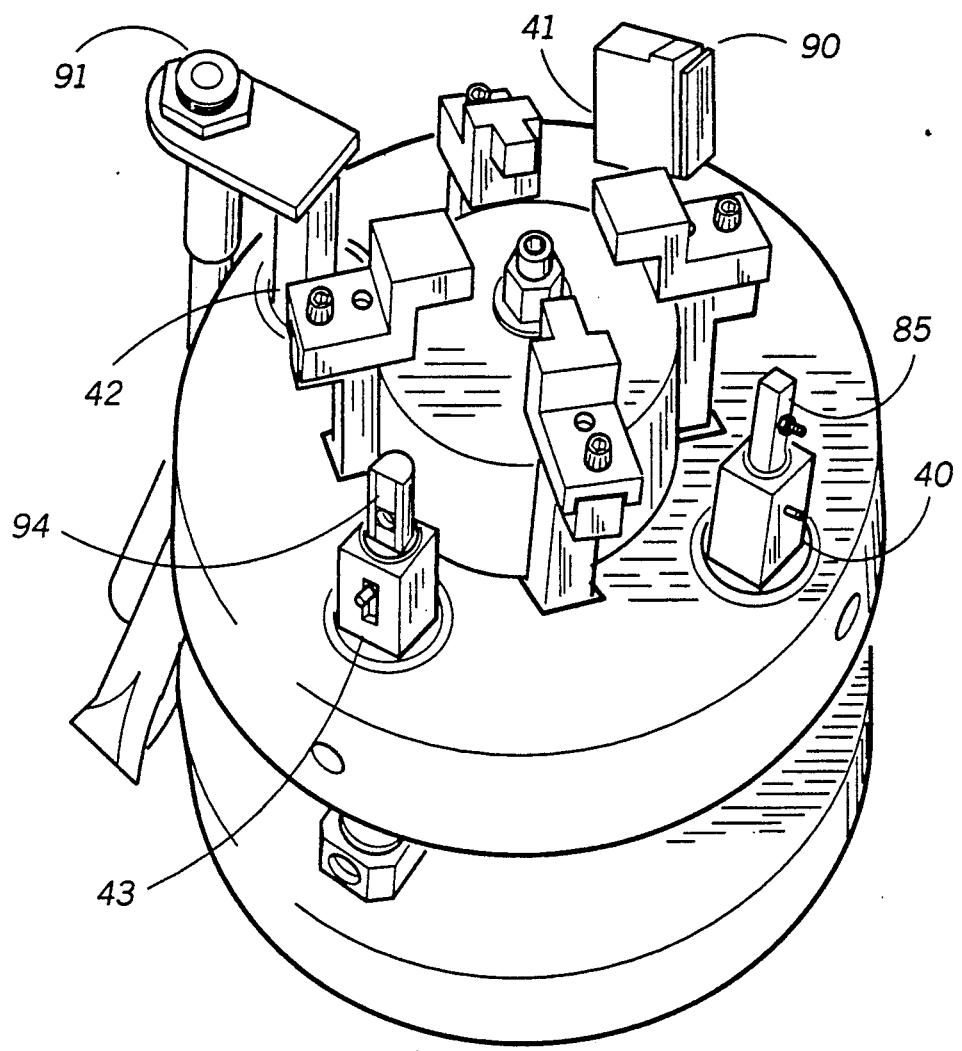
FIG. 1 is a view in perspective of a multi-function robot arm end effector, generally from the operating end thereof, embodying the present invention.
Figure 2:
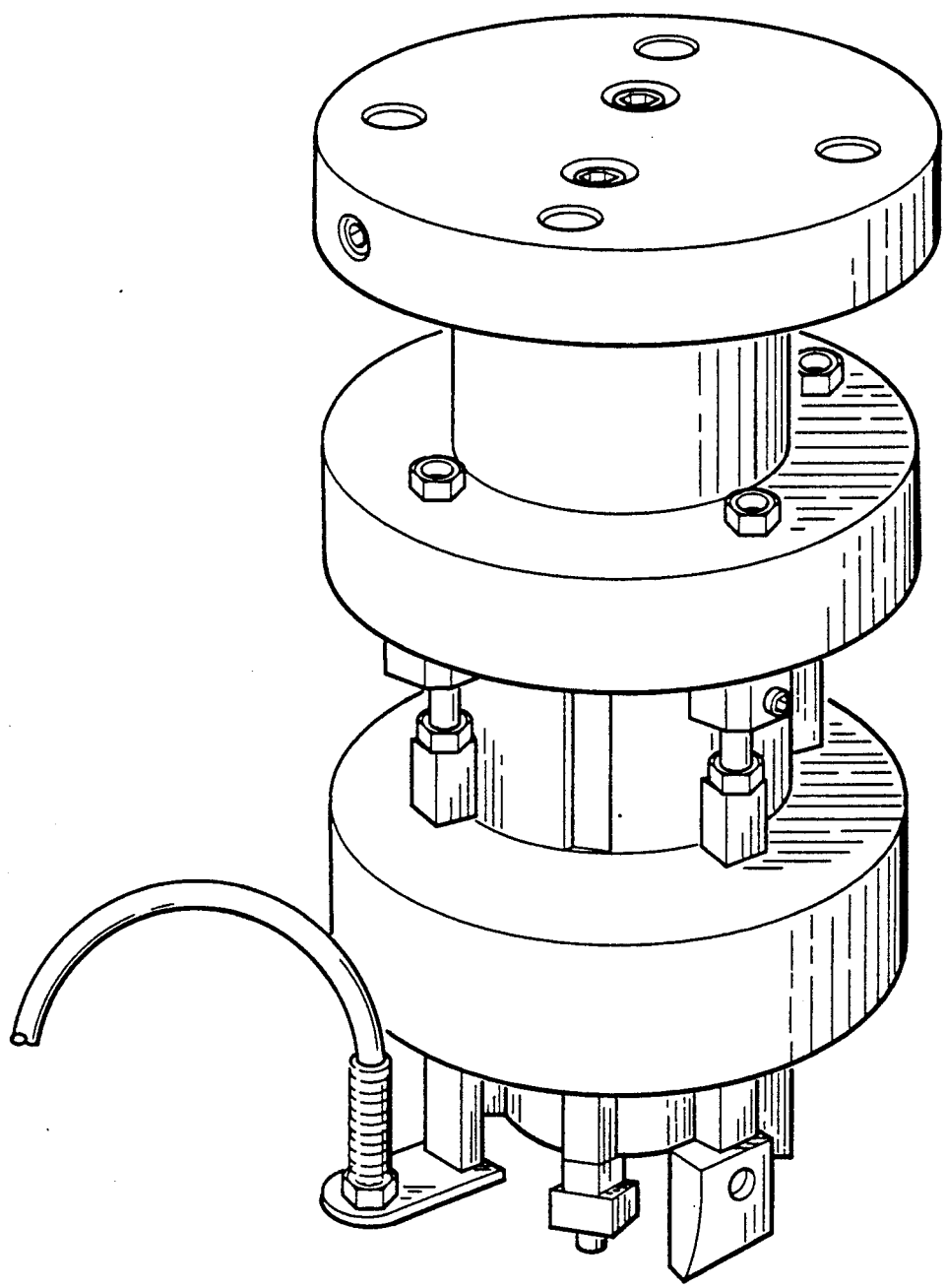
FIG. 2 is a view in perspective similar to the view in FIG. 1, but generally from the opposite end thereof.
Figure 3:
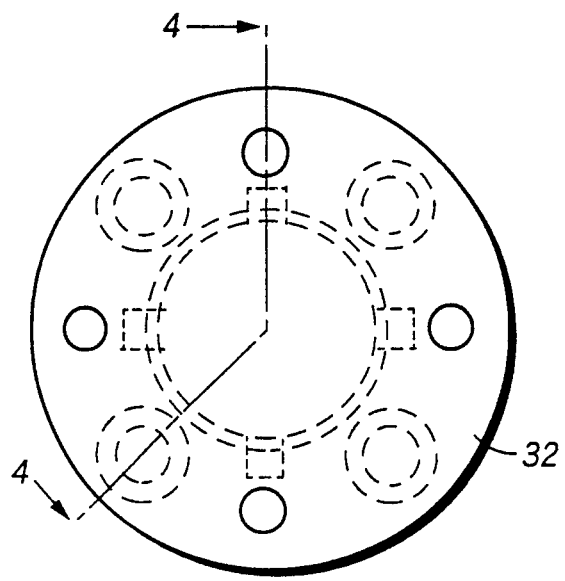
FIG. 3 is a plan view from the nonoperating end of the robot arm end effector of FIG. 1.

Referring specifically to FIGS. 1 through 4 a single purpose robot arm end effector 20 is illustrated, which has been converted to a multi-function end effector. Single purpose end effector 20 is a commercially available robot arm, ROBOHAND SM100, sold by Robohand Inc., Trumbull, Connecticut. With arms 28 extended outward, vacuum nozzle 21 is moved into the extended position. The robot moves the nozzle over the component, and the vacuum is activated. The nozzle picks the component up and retracts it to the original position. At this time, the four component grippers 26 (i.e. centering arms) close in from four sides and center the component on the vacuum nozzle. The arms return to the outward position, the nozzle returns to the extended position, and the robot is ready to place the component as directed.

To convert single purpose end effector 20 into a multi-function end effector the following apparatus and method is utilized. An elongated hollow cylindrically shaped frame 30 is provided. Frame 30 includes three radially outwardly extending collars 32, 34 and 36 spaced axially along the periphery thereof. Frame 30 has one end closed and is adapted to receive single purpose end effector 20 coaxially therein. Screws 37 are threadedly engaged through the end of frame 30 and into the nonoperating end of single purpose end effector 20 to hold the two components together. Collar 32 is positioned adjacent the closed end of frame 30 and is utilized to mount the completed assembly onto the robot (not shown) or other structure utilized to provide movements to the robot arm.

Figure 4:
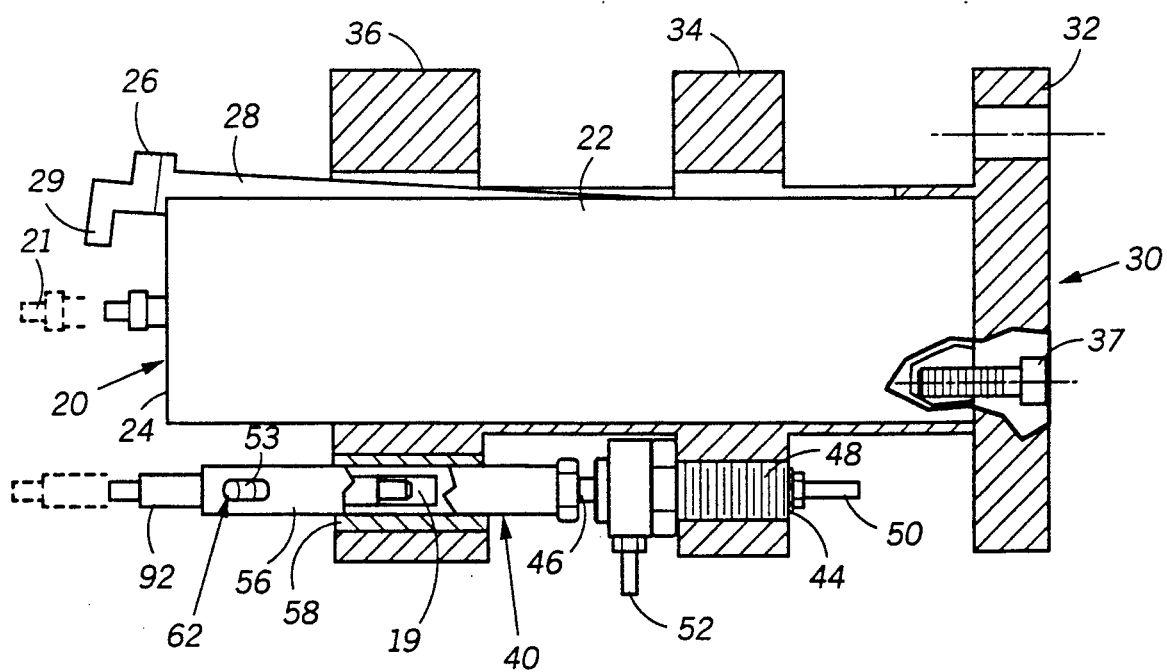
FIG. 4 is a sectional view as seen from the line 4—4 in FIG. 3, with portions shown in broken lines illustrating a different position and portions thereof broken away.

Frame 30 includes four similar drivers 40, 41, 42 and 43 mounted in collars 34 and 36. Because all of the drivers are similar, only driver 40 will be described in detail. Referring specifically to FIG. 4, a detailed view of driver 40 is illustrated. Driver 40 includes a fluid operated piston 44 having a moveable connecting rod 46 and a body 48 thread along the outer periphery thereof. Body 48 is threadedly engaged in an opening in collar 34 and positioned so that connecting rod 46 moves axially along the outside of frame 30. Piston 44 has a first fluid inlet 50 and a second fluid inlet 52 adapted to be connected to a controllable source of fluid under pressure. When pressurized fluid is applied to first inlet 50, connecting rod 46 moves into an extended position and when pressurized fluid is applied to second inlet 52, connecting rod 46 moves into a retracted position.

Driver 40 further includes an elongated shaft 56 threadedly engaged with connecting rod 46 for axial movements therewith. A cylindrical sleeve 58, illustrated in detail in FIGS. 5A and 5B, is fixedly engaged in an axially extending opening through collar 36. Shaft 56 is slidingly engaged through sleeve 58 so that sleeve 58 operates as a guide and bearing for the axial movements of shaft 56. FIGS. 6A, 6B and 6C illustrate shaft 56 in more detail. As can be seen from these drawings, shaft 56 is constructed with a square cross section so that rotary movement and the consequent misalignment which would be produced thereby are prevented. Shaft 56 has an axially extending opening 59 in one end thereof for threadedly receiving one end of connecting rod 46. The opposite end of shaft 56 also has an axially extending opening 60 therein for receiving an operating head. A moveable locking pin 62 is engaged in an elongated opening 63 in the side of shaft 56, which elongated opening 63 is formed in the side of shaft 56 and extends into communication with opening 60. When an operating head is inserted into opening 60 pin 62 engages a radial hole in the operating head and fixedly locks the operating head in shaft 56. Opening 63 also allows operating heads 92 to comply in case of Z-axis overtravel. Spring 19 having a diameter of the smallest diameter operating head is provided to compensate for Z-axis overtravel or component thickness variation.

FIGS. 7 through 11 illustrate different operating heads which may be used in conjunction with drivers 40 through 43. FIGS. 7A and 7B illustrate an operating head 65 which may be utilized to pick up and position small surface mount filters in metal housing. Operating head 65 includes an elongated shank 66 constructed to fit within opening 60 in shaft 56. A hole 68 in shank 66 is positioned to receive pin 62 therein when operating head 65 is properly positioned (both in rotation and axially). The outwardly extending end of operating head 65 is formed with a generally rectangular cross section and the end thereof is concave with a generally semicylindrical shape. An axially extending fluid conduit 70 is formed from the end surface inwardly and a radially extending conduit 72 is formed in the side of operating head 65 in communication with axially extending conduit 70. A controllable source of fluid pressure (in this case a vacuum) is connected to conduit 72 to form a slight vacuum at the end surface so that small components can be picked up and retained by operational head 65.

Figure 11C:
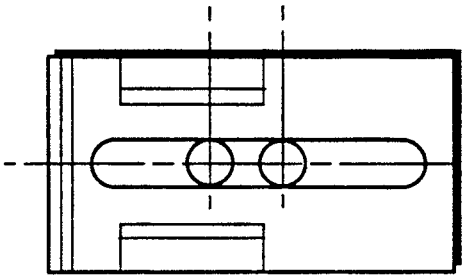
FIGS. 11A, 11B and 11C are a side view, an enlarged, rotated side view and an enlarged right end view, respectively, of a fifth operating head for the multi-function robot arm end effector illustrated in FIG. 1.
Figure 11B:
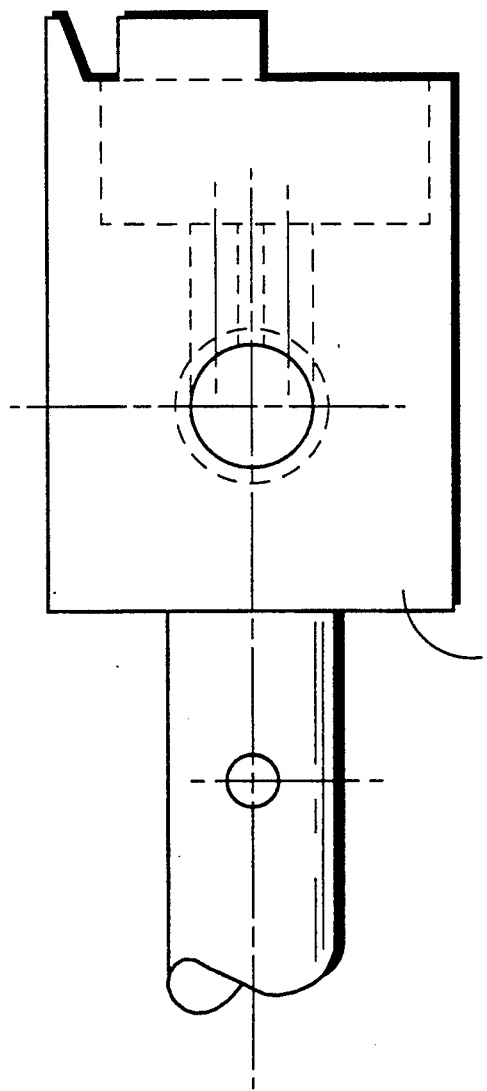
Figure 11A:
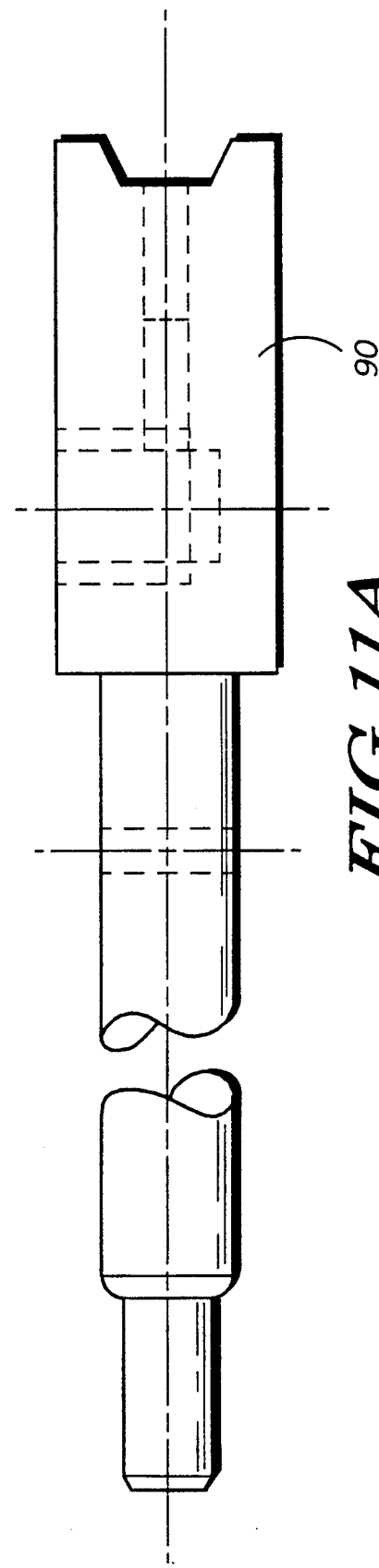

FIGS. 8A and 8B illustrate an operating head 75 having an end constructed to pick up and retain smaller components than operating head 65. In this case the surface is constructed so that it can only pick up flat rectangular components, such as unpackaged semiconductor chips. FIGS. 9A and 9B illustrate an operating head 80 designed to pick up and retain relatively large components, such as an 8 pin female connector. FIGS. 10A and 10B illustrate an operating head 85 designed to pick up and retain very small components such as semiconductor capacitors and the like. Operating head 85 is illustrated in FIG. 4 engaged in driver 40. FIGS. 11A, 11B and 11C illustrate still another type of operating head 90 (also illustrated in FIG. 1 engaged in driver 41) designed to pick up and retain odd shaped components, such as a small male connector (illustrated in operating head 90 in FIG. 1).

In a typical operation of the apparatus as assembled and illustrated in FIGS. 1-4, frame 30 is operatively attached to a robot arm, fluid inlets 50 and 52 are attached to a controllable source of fluid pressure and the fluid conduit in each operating head (conduit 72 in operating head 65) is connected to a controllable source of fluid pressure. Generally, the robot unit will have the capabilities to control all of the drivers and operating heads, as well as the robot arm. Essentially, the various fluid inlets and conduits are controlled by a computer which is programmed in a well known fashion to perform all of the steps in the correct order and in the correct time.

The robot arm is controlled to move operating head 85 to a stock of semiconductor chip capacitors and the fluid pressure is controlled so that a chip capacitor is piked up and retained in operating head 85. The robot arm is then controlled to move to a stock of connectors and the fluid pressure is controlled so that a connector is picked up and retained in operating head 41. The robot arm is then controlled so that it is positioned adjacent to a printed circuit board (not shown) to be assembled. The fluid pressure on fluid inlet 50 of driver 42 is controlled so that driver 42 moves into a first or extended position in which an operating head 91 attached thereto is extended beyond the operating end of end effector 20, as shown in broken lines in FIG. 4. Operating head 91 is utilized to measure, the printed circuit board relative to the multi-function end effector. Once the location of the printed circuit board is known to the robot, fluid pressure on fluid inlet 50 is released and fluid pressure on fluid inlet 52 is increased to retract driver 42 and operating head 91.

Maintaining the multi-function end effector the same distance from the printed circuit board, the robot arm is rotated until operating head 94 is directly adjacent to an area on which a chip capacitor is to be mounted. Fluid pressure is then applied to the fluid inlet 50 to cause operating head 94 to move into the first or extended position. A measured amount of solder paste is dispensed onto the printed circuit board from operating head 94 by applying fluid pressure either to the solder paste directly or to some type of pressure device, such as a piston or the like. The fluid pressure on fluid inlet 50 is then released and fluid pressure is applied to fluid inlet 52 to retract operating head 94. The robot arm is then controlled so that operating head 85 is positioned adjacent to the designated area. Fluid inlet 50 of driver 40 is pressurized to move operating head 85 into the extended position and fluid pressure on the fluid conduit of operating head 85 is removed to release the chip capacitor. Fluid pressure on fluid inlet 50 is released and fluid inlet 52 is pressurized to move operating head 85 into the retracted position.

Utilizing operating head 91 for measurement and operating head 90 for placement, as described above, the connector retained in operating head 90 is properly positioned in the printed circuit board. The operating heads (those illustrated and/or others) can pick and place a variety of odd shaped components such as 8 pin male and female connectors, battery contacts, trim capacitors, lamps, switches, air wound coils, etc.

It will of course be understood by those skilled in the art that the above description is only by way of example and that many more or different types of operating heads may be included in the multi-function end effector. Further, while a purchased single purpose end effector is modified into a multi-function end effector in this description it will be clear that a base can be manufactured or provided for use in place of the single purpose end effector, which base can have a frame mounted thereon as described or can include the frame as an integral portion thereof, and such a base should be considered the full equivalent of the described structure. Each end effector will generally be designed to perform a series of predetermined tasks on a specific piece of apparatus and, because the end effector can perform a plurality of functions, the robot arm can be designed to be used a substantial amount of the time. Further, because the arm is already in position many of the tasks can be performed with a substantial saving of time. Thus, the present invention allows a robot cell to be fully utilized, more flexible and better balanced.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of converting a single purpose robot arm end effector into a multi-function robot arm end effector comprising the steps of:
    affixing a frame to the single purpose end effector adjacent an operating portion thereof;
    mounting a plurality of drivers in the frame so that each driver is individually moveable between a first operating position in which the driver is extended beyond the operating portion of the end effector and a second nonoperating position in which the driver is retracted;
    operatively attaching a plurality of operating heads each designed to perform a predetermined task one each to one of the plurality of drivers; and
    attaching controllable power means to each of the operating heads for controlling each of the heads to perform the predetermined task in response to control signals applied thereto and further attaching the controllable power means to the drivers for individually controlling the movement of the drivers between the first position and the second position.

2. A method of utilizing a multi-purpose robot arm for manufacturing an electronic device comprising the steps of:
    providing a robot arm end effector with a base having a plurality of drivers mounted therein for individual movement between a first operating position and a second nonoperating position, each driver having mounted therein an operating head designed to perform a predetermined task and positioned so as to extend beyond an operating end of the robot arm end effector when the associated driver is moved to the first position, and controllable means attached to each of said operating heads for controlling each of said operating heads to perform the predetermined task in response to control signals applied thereto, and further attached to said drivers for individually controlling the movement of said drivers between the first and second positions;
    supplying a first operating head constructed to dispense solder paste;
    supplying a second operating head constructed to hold semiconductor chips;
    providing a printed circuit board on which a provided semiconductor chip is to be soldered;
    controlling the second operating head to pick-up and retain a selected semiconductor chip;
    controlling the robot arm to position the first operating head adjacent a position on the printed circuit board at which it is desired to solder the semiconductor chip, supplying a control signal to the associated driver to move the first operating head into the first position, supplying a control signal to the controllable means to dispense solder paste onto the printed circuit board and supplying a second control signal to the associated driver to move the first operating head into the second position;
    controlling the robot arm to position the second operating head adjacent the solder paste on the printed circuit board supplying a control signal to the associated driver to move the second operating head into the first position, supplying a control signal to the controllable means to release the semiconductor chip retained by the second operating head and supplying a second control signal to the associated driver to move the second operating head into the second position; and
    repeating steps five through seven for each printed circuit board provided.

3. A multi-function robot arm end effector comprising:
    a base constructed to function as part of a robot arm, said base attached to said robot arm and capable of receiving a second end effector;
    a plurality of drivers each individually retractably mounted on said base for movement between a first operating position and a second nonoperating position in which the driver is retracted;
    a plurality of operating heads each designed to perform a predetermined task and each being operatively attached to one of said plurality of drivers; and
    controllable power means attached to each of said operating heads for controlling each of said operating heads to perform the predetermined task in response to control signals applied thereto and further attached to said drivers for individually controlling the movement of said drivers between the first operating position and the second nonoperating position.

4. Apparatus for converting a single purpose robot arm end effector to a multifunctional end effector comprising:
    a frame fixedly attached to function as part of the robot arm, said frame capable of receiving a second end effector;
    a plurality of drivers each individually retractably mounted on said frame for movement between a first operating position and a second nonoperating position in which the driver is retracted;
    a plurality of operating heads each designed to perform a predetermined task and each being operatively attached to one of said plurality of drivers; and
    controllable power means attached to each of said operating heads for controlling each of said operating heads to perform the predetermined task in response to control signals applied thereto, and further attached to said drivers for individually controlling the movement of said drivers between the first operating position and the second nonoperating position.

5. Apparatus as claimed in claim 4 wherein the robot arm end effector is substantially cylindrically shaped with a mounting end and an operating end and the frame extends around the circumference thereof with the drivers mounted so that in the first operating position the drivers move axially along the robot arm end effector to a position in which they extend beyond the operating end of the robot arm end effector and in the second nonoperating position the drivers are retracted so as not to extend beyond the operating end of the robot arm end effector.

6. Apparatus as claimed in claim 4 wherein the drivers each include a fluid cylinder designed to provide the movement between the first operating position and the second nonoperating position.

7. Apparatus as claimed in claim 4 wherein the controllable power means includes a controllable source of fluid.

8. Apparatus as claimed in claim 4 wherein at least one of the plurality of heads includes an air suction device for picking up relatively small electronic components.

9. Apparatus as claimed in claim 4 further comprising means on said air suction device for compensating for variations in electronic component thickness.

10. Apparatus as claimed in claim 4 wherein at least one of the plurality of heads includes a solder paste dispenser.

11. Apparatus as claimed in claim 4 wherein at least one of the plurality of heads includes a board position measuring device.

* * * * *